(12) United States Patent
Henzler et al.

(10) Patent No.: US 8,243,555 B2
(45) Date of Patent: Aug. 14, 2012

(54) APPARATUS AND SYSTEM WITH A TIME DELAY PATH AND METHOD FOR PROPAGATING A TIMING EVENT

(75) Inventors: Stephan Henzler, Taufkirchen (DE); Siegmar Koeppe, Munich (DE)

(73) Assignee: Infineon Technologies AG, Neubiberg (DE)

( * ) Notice: Subject to any disclaimer, the term of this patent is extended or adjusted under 35 U.S.C. 154(b) by 836 days.

(21) Appl. No.: 12/187,404

(22) Filed: Aug. 7, 2008

(65) Prior Publication Data
US 2010/0034056 A1  Feb. 11, 2010

(51) Int. Cl.
G04F 8/00 (2006.01)
G04F 10/00 (2006.01)
H03L 7/00 (2006.01)
H03H 11/26 (2006.01)

(52) U.S. Cl. ......... 368/113; 368/120; 327/161; 327/261
(58) Field of Classification Search .................. 368/113, 368/118–120; 327/158, 161, 277, 284, 261, 327/263
See application file for complete search history.

(56) References Cited

U.S. PATENT DOCUMENTS

| | | | |
|---|---|---|---|
| 4,719,608 A | 1/1988 | Genat et al. | |
| 5,703,838 A | 12/1997 | Gorbics et al. | |
| 5,719,514 A * | 2/1998 | Sato | 327/262 |
| 5,745,533 A * | 4/1998 | Asada et al. | 375/354 |
| 5,838,754 A | 11/1998 | Gorbics et al. | |
| 6,097,674 A | 8/2000 | Swapp | |
| 6,232,806 B1 * | 5/2001 | Woeste et al. | 327/149 |
| 6,233,205 B1 * | 5/2001 | Wells et al. | 368/118 |
| 6,346,842 B1 * | 2/2002 | Hall et al. | 327/277 |
| 6,509,776 B2 * | 1/2003 | Kobayashi et al. | 327/277 |
| 6,639,441 B2 * | 10/2003 | Ono et al. | 327/175 |
| 6,717,479 B2 * | 4/2004 | Suda | 331/57 |
| 6,724,228 B2 * | 4/2004 | Kashiwazaki | 327/158 |
| 6,754,613 B2 | 6/2004 | Tabatabei et al. | |
| 6,838,912 B1 | 1/2005 | Chou | |
| 7,161,402 B1 * | 1/2007 | Sompur et al. | 327/158 |
| 7,253,670 B2 * | 8/2007 | Sasaki | 327/161 |
| 2003/0006750 A1 | 1/2003 | Roberts et al. | |
| 2006/0284693 A1 | 12/2006 | Nelson | |
| 2009/0225631 A1 * | 9/2009 | shimizu et al. | 368/113 |

FOREIGN PATENT DOCUMENTS
DE  10141070 A1  4/2002

OTHER PUBLICATIONS

Chorng-Sii Hwang, Poki Chen, Hen-Wai Tsao; A High-Precision Time-To-Digital Converter Using a Two-Level Conversion Scheme; IEEE; 2004; pp. 174-176.

Poki Chen, Jia-Chi Zheng, Chun-Chi Chen; A Monolithic Vernier-Based Time-to-Digital Converter with Dual PLLs for Self-Calibration; IEEE 2005 Custom Integrated Circuits Conference; pp. 321-324.

Kostas Karadamoglou, Nick Paschalidis, Nikos Stamatopoulos, George Kottaras, Vassilis Paschalidis, E. Sarris; A CMOS Time to Digital Converter for Space Science Instruments; ESSCIRC 2002; pp. 707-710.

(Continued)

*Primary Examiner* — Vit Miska
(74) *Attorney, Agent, or Firm* — Infineon Technologies AG Patent Department

(57) ABSTRACT

Implementations are presented herein that include a time delay path.

22 Claims, 6 Drawing Sheets

OTHER PUBLICATIONS

Jussi Jansson, Antti Mäntyniemi, Juha Kostamovaara; A Delay Line Based CMOS Time Digitizer IC with 13 ps Single-shot Precision; IEEE 2005; pp. 4269-4272.

J. Kalisz, M. Pawlowski, R. Pelka; Error analysis and design of the Nutt time-interval digitiser with picosecond resolution; J. Phys. Sci. Instrum. 20 (1987); pp. 1330-1341; Printed in UK.

Jussi-Pekka Jansson, Antti Mäntyniemi, Juha Kostamovaara; A CMOS Time-to-Digital Converter With Better Than 10 ps Single-Shot Precision; IEEE Journal of Solid-State Circuits, vol. 41. No. 6; Jun. 2006; pp. 1286-1296.

Robert Bogdan Staszewski, Sudheer Vemulapalli, Prasant Vallur, John Wallberg, Poras T. Balsara; 1.3 V 20 ps Time-to-Digital Converter for Frequency Synthesis in 90-nm CMOS; IEEE Transactions on Circuits and Systems—II. Express Briefs, vol. 53; Mar. 2006; pp. 220-224.

Stephen Henzler, Siegmar Koeppe, Winfried Kamp, Hans Mulatz, Doris Schmitt-Landsiedel; 90mn 4.7ps-Resolution 0.7-LSB Single-Shot Precision and 19pJ-perShot Local Passive Interpolation Time-to-Digital Converter with On-Chip Characterization; ISSCC 2008 / Session 30 / Data-Converter Techniques / 30.5; 2008 IEEE International Solid-State Circuits Conference; pp. 548-549, p. 635.

Stephan Henzler, Siegmar Koeppe, Dominik Lorenz, Winfried Kamp, Ronald Kuenemund, Doris Schmitt-Landsiedel; A Local Passive Time Interpolation Concept for Variation-Tolerant High-Resolution Time-to-Digital Conversion; IEEE Journal of Solid-State Circuits, vol. 43, No. 7, Jul. 2008; pp. 1666-1676.

Poki Chen, Shen-Iuan Liu, Jingshown Wu; A CMOS Pulse-Shrinking Delay Element for Time Interval Measurement; IEEE Transactions on Circuits and Systems—II, Analog and Digital Signal Processing, vol. 47, No. 9 Sep. 2000; pp. 954-958.

Elvi Räisänan-Ruotsalainen, Timo Rahkonen, Juha Kostamovaara; A Low-Power CMOS Time-to-Digital Digital Converter; IEEE Journal of Solid-State Circuits, vol. 30, No. 9, Sep. 1995; pp. 984-990.

Nazmy Abaskharoun, Gordon W. Roberts; Circuits for On-Chip Sub-Nanosecond Signal Capture and Characterization; IEEE 2001 Custom Integrated Circuits Conference; pp. 251-254.

Piotr Dudek, Stanislaw Szczepanski, John V. Hatfield; A High-Resolution CMOS Time-to-Digital Converter Utilizing a Vernier Delay Line; IEEE Transactions on Solid-State Circuits, vol. 35, No. 2, Feb. 2000; pp. 240-247.

\* cited by examiner

APPARATUS AND SYSTEM WITH A TIME DELAY PATH AND METHOD FOR PROPAGATING A TIMING EVENT

BACKGROUND

There are many applications in which the accurate measurement of a time interval is useful. For example, accurate time interval measurement is used in phase detectors of digital phase-locked-loops (PLLs), in analog-to-digital converters and in high resolution measurement equipment. An industry-wide trend to replace more analog, mixed signal, and radio frequency functionality with increasingly faster digital solutions further enhances the need for high-resolution time measurement.

Time-to-digital converters (TDCs) are often used for such accurate time measurements. For example, a TDC can be used to measure the duration of time that has elapsed between a START and a STOP pulse or any other timing event. Typically, TDC circuits digitize time by utilizing the propagation delay of delay cells, which can vary significantly due to process, voltage and temperature (PVT) variations. It is generally desirable to provide a TDC that overcomes the effects of PVT variations and that can be designed and implemented independent of process parameters.

BRIEF DESCRIPTION OF THE DRAWINGS

The detailed description explains exemplary implementations with reference to the accompanying figures. In the figures, the left-most digit of a reference number identifies the figure in which the reference number first appears.

DETAILED DESCRIPTION

At least one implementation described herein relates to an apparatus including a first time delay path that has a plurality of delay elements that are spaced substantially equally apart and two delay elements that are spaced differently than the plurality of delay elements spaced substantially equally apart. The apparatus also includes a second time delay path that is coupled to the first time delay path.

Each of the delay elements may be any circuit element that delays the propagation of a signal, such as but not limited to one or more logic gates (e.g., an OR gate, or one or more inverters), buffers, amplifiers, or an RC propagation delay of a wire line.

Another implementation described herein relates to a method of propagating a timing event through a first time delay path. The first time delay path includes a plurality of delay elements that are spaced substantially equally apart and two delay elements that are spaced differently than the plurality of delay elements spaced substantially equally apart. The method may include propagating the timing event through a second time delay path. The second time delay path may be coupled to the first time delay path. The method may further include measuring a propagation time of the timing event through the first time delay path and correcting an error induced by the two delay elements that are spaced differently.

Exemplary Arrangements

Figure 1:
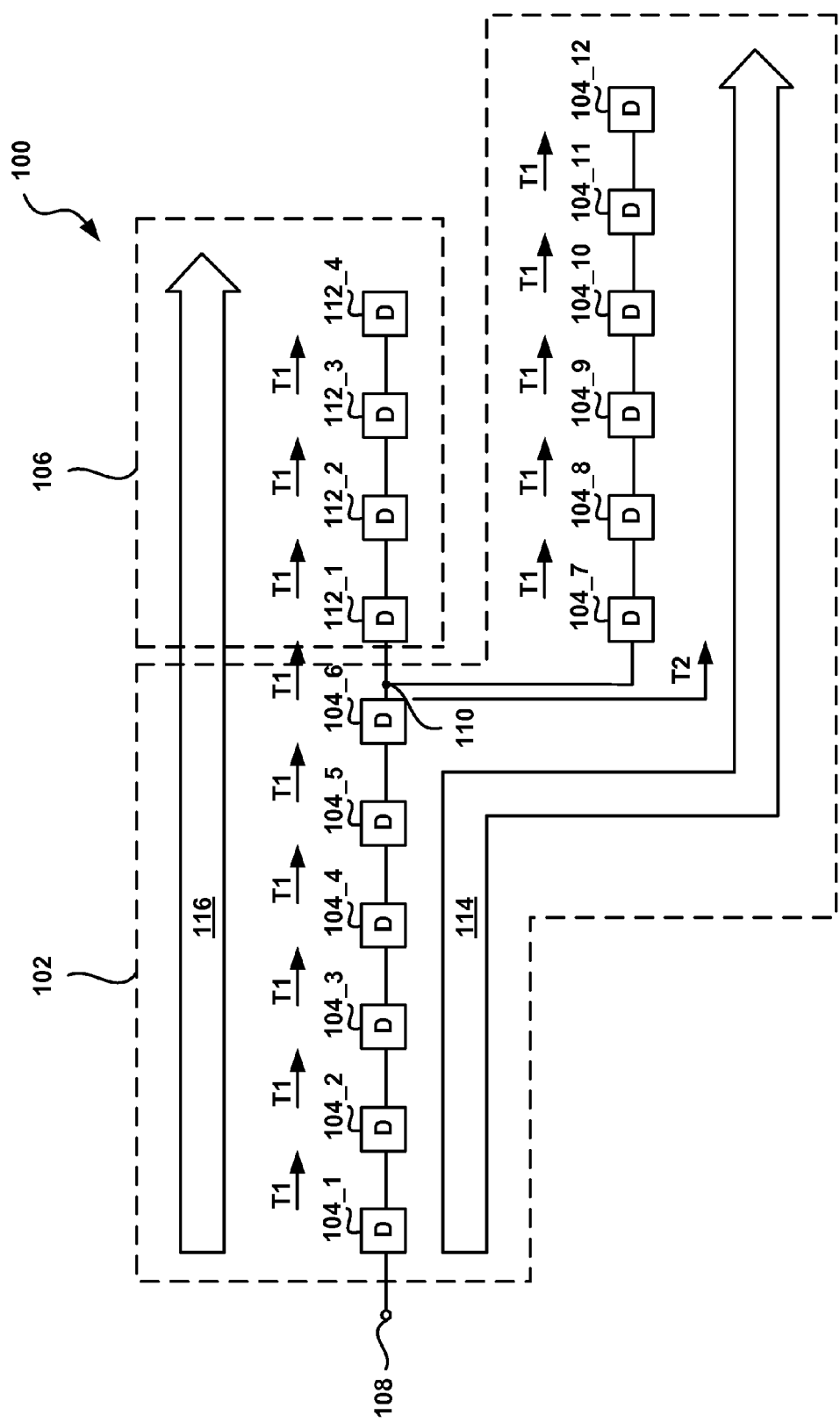
FIG. 1 shows an exemplary device with a first time delay path.

FIG. 1 shows an exemplary device 100 with a first time delay path 102. The first time delay path 102 may include delay elements 104_1, 104_2, ... 104_12. A plurality of the delay elements 104_1, 104_2, ... 104_12 may be spaced substantially equally apart. Two delay elements 104_6 and 104_7 of the delay elements 104_1, 104_2, ... 104_12 may be spaced differently than the plurality of delay elements that are spaced substantially equally apart. A second time delay path 106 may be coupled to the first time delay path 102, between the two delay elements 104_6 and 104_7 that are spaced differently.

In one implementation, the delay elements 104_1, 104_2, ... 104_12 may be coupled in series to form a chain of delay elements of the first time delay path 102. Each of the delay elements 104_1, 104_2, ... 104_12 may have an input and an output, and an output of a delay element 104_$i$ may be coupled to an input of a subsequent delay element 104_$i$+1.

An input terminal 108 of the device 100 may be coupled to the delay element 104_1 of the chain of delay elements of the first time delay path 102. A signal may be received at the input terminal 108. A timing event, triggered by the received signal, may propagate through the first time delay path 102. The timing event may be, for example, a transition (such as a transition from logical zero to logical one, or vice versa), a pulse, a spike, a crossing of a predetermined reference level, and/or an occurrence of a signal change having at least a predetermined rate of change.

The timing event may be delayed by the delay elements 104_1, 104_2, ... 104_12 of the first time delay path 102. Each of the delay elements 104_1, 104_2, ... 104_12 may cause a predetermined delay D. The delay D produced by each of the delay elements 104_1, 104_2, ... 104_12 of the first time delay path 102 may be substantially the same.

The timing event may be delayed between an output of a delay element 104_$i$ and an input of a subsequent delay element 104_$i$+1. A delay T1 of the timing event between any two adjacent delay elements 104_1, 104_2, ... 104_12 of the first time delay path 102 may be substantially the same, excluding the two delay elements 104_6 and 104_7. The timing event may be delayed between an output of the delay element 104_6 and an input of the delay element 104_7 by a delay T2 that is different from the delay T1.

For example, delay elements 104_1, 104_2, ... 104_6 may form a first plurality of delay elements of the first time delay path 102. The delay elements 104_1, 104_2, ... 104_6 of the first plurality of delay elements may be equally spaced and a delay T1 between any two adjacent delay elements of the first plurality of delay elements 104_1, 104_2, ... 104_6 may be substantially the same, i.e., a delay T1 between an output of a delay element 104_1 and an input of a delay element 104_2 may be substantially the same as a delay T1 between an output of a delay element 104_2 and an input of a delay element 104_3, and so on.

Delay elements 104_7, 104_8, ... 104_12 may form a second plurality of delay elements of the first time delay path 102. The delay elements 104_7, 104_8, ... 104_12 of the second plurality of delay elements may be equally spaced and a delay T1 between any two adjacent delay elements of the second plurality of delay elements 104_7, 104_8, ... 104_12 may be substantially the same, i.e., a delay T1 between an output of a delay element 104_7 and an input of a delay element 104_8 may be substantially the same as a delay T1 between an output of a delay element 104_8 and an input of a delay element 104_9, and so on.

The delay T1 between an output of a delay element 104_*i* and an input of a subsequent delay element 104_*i*+1 of the first plurality of delay elements 104_1, 104_2, . . . 104_6 may be substantially the same as the delay T1 between an output of a delay element 104_*i* and an input of a subsequent delay element 104_*i*+1 of the second plurality of delay elements 104_7, 104_8, . . . 104_12. The first plurality of delay elements 104_1, 104_2, . . . 104_6 and the second plurality of delay elements 104_7, 104_8, . . . 104_12 may form a plurality of delay elements of the first time delay path 102 that are spaced substantially equally apart.

The delay element 104_6 may be a last delay element 104_6 of a chain of delay elements of the first plurality of delay elements 104_1, 104_2, . . . 104_6. The delay element 104_7 may be a first delay element 104_7 of a chain of delay elements of the second plurality of delay elements 104_7, 104_8, . . . 104_12. The last delay element 104_6 and the first delay element 104_7 may be coupled in series. The two delay elements 104_6 and 104_7 of the first time delay path 102 may be spaced differently than the plurality of delay elements of the first time delay path 102 that are spaced substantially equally apart. A delay T2 between the output of the last delay element 104_6 and the input of the subsequent first delay element 104_7 may be different from the delay T1.

A connection between any two adjacent, equally spaced, delay elements may be substantially the same, and the delay T1 of a timing event produced by the connection between the equally spaced delay elements of the first time delay path 102 may be substantially the same. The delay T1 produced by the connection may be determined by a driver strength of a delay element, a connection line between the delay element and a subsequent delay element and an input load of the subsequent delay element. For example, a length of a connection line between the last delay element 104_6 of the first plurality of delay elements 104_1, 104_2, . . . 104_6 and the first delay element 104_7 of the second plurality of delay elements 104_7, 104_8, . . . 104_12 may be longer than a length of the connection line between the equally spaced delay elements of the first time delay path 102. Therefore, the delay T2 of a timing event produced by the connection between the last delay element 104_6 and the first delay element 104_7 may be bigger than the delay T1.

For example, the two delay elements that are spaced differently may be characterized by a connection line that is different from connection lines between equally spaced delay elements, as shown in FIG. 1. Additionally or alternatively, the two delay elements that are spaced differently may be characterized by one or more circuit elements, e.g. a buffer element, that is placed between the two delay elements and/or local defects or local parameter variations between the two delay elements.

The second time delay path 106 may be coupled to a node 110 of the first time delay path 102 between the two delay elements 104_6 and 104_7 that are spaced differently. The second time delay path 106 may include a plurality of delay elements 112_1, 112_2, 112_3 and 112_4. Each of the delay elements 112_1, 112_2, 112_3 and 112_4 of the second time delay path 106 may cause a predetermined known delay D. The delay D produced by each of the delay elements 112_1, 112_2, 112_3 and 112_4 may be substantially the same. The delay D produced by each of the delay elements 112_1, 112_2, 112_3 and 112_4 of the second time delay path 106 may be substantially the same as the delay D produced by each of the delay elements 104_1, 104_2, . . . 104_12 of the first time delay path 102.

The plurality of delay elements 112_1, 112_2, 112_3 and 112_4 of the second time delay path 106 may be coupled in series to form a chain of delay elements of the second time delay path 106. Each of the delay elements 112_1, 112_2, 112_3 and 112_4 may have an input and an output, and an output of a delay element 112_*i* may be coupled to an input of a subsequent delay element 112_*i*+1.

The delay elements 112_1, 112_2, 112_3 and 112_4 of the second time delay path 106 may be spaced substantially equally apart. A timing event may propagate through the second time delay path 106 and it may be delayed between an output of a delay element 112_*i* and an input of a subsequent delay element 106_*i*+1. A delay T1 of the timing event between any two adjacent delay elements 112_1, 112_2, 112_3 and 112_4 of the second time delay path 106 may be substantially the same. The delay T1 of the timing event between the delay elements 112_1, 112_2, 112_3 and 112_4 of the second time delay path 106 may be substantially the same as the delay T1 of the timing event between the delay elements 104_1, 104_2, . . . 104_12 of the first time delay path 102 that are substantially equally spaced.

The first plurality of delay elements 104_1, 104_2, . . . 104_6 of the first time delay path 102 and the plurality of delay elements 112_1, 112_2, 112_3 and 112_4 of the second time delay path 106 may be coupled in series. The delay element 112_1 may be a first delay element 112_1 of a chain of delay elements of the second time delay path 106. An input of the first delay element 112_1 of the second time delay path 106 may be coupled to an output of the last delay element 104_6 of the first plurality of delay elements 104_1, 104_2, . . . 104_6 of the first time delay path 102. The delay T1 of a timing event between the output of the last delay element 104_6 and the input of the first delay element 112_1 may be substantially the same as the delay T1 of the timing event between the delay elements 112_1, 112_2, 112_3 and 112_4 of the second time delay path 106 and/or the delay T1 of the timing event between the delay elements 104_1, 104_2, . . . 104_12 of the first time delay path 102 that are substantially equally spaced. The second time delay path 106 may form an extension of the first plurality of delay elements 104_1, 104_2, . . . 104_6 of the first time delay path 102. The first plurality of delay elements 104_1, 104_2, . . . 104_6 of the first time delay path 102 and the plurality of delay elements 112_1, 112_2, 112_3 and 112_4 of the second time delay path 106 may be spaced substantially equally apart. The delay T1 of the timing event between any two adjacent delay elements may be substantially the same.

In one implementation, a delay D produced by delay elements that are spaced substantially equally apart may be different. However, the sum of the delay D and a delay T1 produced by the connection between two of the equally spaced delay elements may be substantially the same. The delay of a timing event between an input of a delay element and an input of a subsequent delay element may be substantially the same. For example, the delay element 104_1 may produce a delay D+m and a connection between an output of the delay element 104_1 and an input of a subsequent delay element 104_2 may produce a delay T1−m. The delay element 104_2 may produce a delay D and a connection between an output of the delay element 104_2 and an input of a subsequent delay element 104_3 may produce a delay T1. The delay element 104_3 may produce a delay D−n and a connection between an output of the delay element 104_3 and an input of a subsequent delay element 104_4 may produce a delay T1+n, and so on. A timing event may be delayed between an input of the delay element 104_6 and the input of the delay element 104_7 by a delay D+T2 that is different from a delay D+T1.

A timing event may be received at the input terminal 108 of the first time delay path 102 and may propagate through the first plurality of delay elements of the first time delay path 102. At the node 110, the timing event may split and it may propagate through the second plurality of delay elements 104_7, 104_8, . . . 104_12 of the first time delay path 102 and through the delay elements 112_1, 112_2, 112_3 and 112_4 of the second time delay path 106.

The delay elements 104_1, 104_2, . . . 104_12 of the first time delay path 102 may form a first propagation path 114 for a timing event received at the input terminal 108. The first plurality of delay elements 104_1, 104_2, . . . 104_6 of the first time delay path 102 and the plurality of delay elements 112_1, 112_2, 112_3 and 112_4 of the second time delay path 106 may form a second propagation path 116 for the timing event received at the input terminal 108. The timing event may propagate partly in parallel through the first propagation path 114 and through the second propagation path 116.

The timing event received at the input terminal 108 may be affected by a discontinuity when propagating through the first propagation path 114. The discontinuity may be caused by the two delay element 104_6 and 104_7 that are spaced differently than the plurality of delay elements of the first propagation path 114 that are spaced substantially equally apart. The timing event received at the input terminal 108 may not be affected by any discontinuity when propagating through the second propagation 116 path because all delay elements of the second propagation path 116 may be spaced substantially equally apart.

The first time delay path 102 may be used to measure a propagation time of the timing event received at the input terminal 108. An accuracy of a measurement of the propagation time may be deteriorated by the discontinuity caused by an irregular spacing of the delay element 104_6 and the delay element 104_7. The irregular spacing of the delay element 104_6 and the delay element 104_7 may form a critical segment of the first time delay path 102 with respect to the measurement of the propagation time. The second time delay path 106 may extend the first time delay path 102 and may be used to correct an inaccuracy caused by the discontinuity in the first time delay path 102. The timing event may propagate from the input terminal 108 through the first plurality of delay elements 104_1, 104_2, . . . 104_6 of the first time delay path 102 to the node 110. Starting from node 110, the timing event may propagate partly in parallel through the second plurality of delay elements 104_7, 104_8, . . . 104_12 of the first time delay path 102 and through the plurality of delay elements 112_1, 112_2, 112_3 and 112_4 of the second time delay path 106. The plurality of delay elements 112_1, 112_2, 112_3 and 112_4 of the second time delay path 106 may replicate the critical segment of the first time delay path 106. As the first plurality of delay elements 104_1, 104_2, . . . 104_6 of the first time delay path 102 and the plurality of delay elements 112_1, 112_2, 112_3 and 112_4 of the second time delay path 106 form a chain of equally spaced delay elements, the second time delay path 106 may be used to correct the inaccuracy caused by the discontinuity in the first time delay path 102.

Depending on a length of a propagation time to be measured, the number of delay elements of the second plurality of delay elements 104_7, 104_8, . . . 104_12 of the first time delay path 102 may be higher than the number of delay elements of the second time delay path 106.

Figure 2:
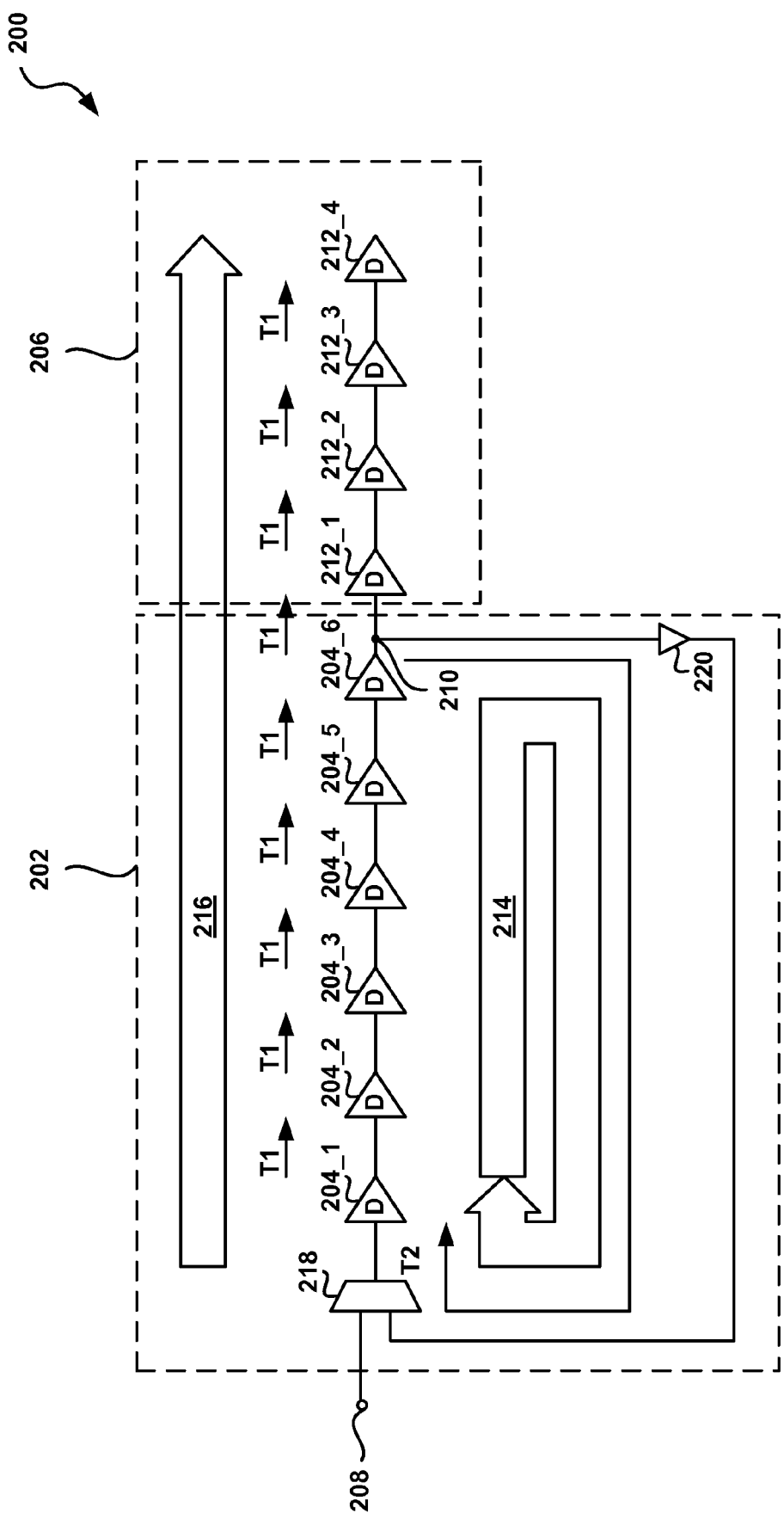
FIG. 2 shows an exemplary device with a first time delay path that includes delay elements that are coupled in a ring configuration.

FIG. 2 shows an exemplary device 200 with a first time delay path 202. The first time delay path 202 may include delay elements 204_1, 204_2, . . . 204_6 that may be implemented as buffer elements. The delay elements 204_1, 204_2, . . . 204_6 may be coupled in a ring configuration. A plurality of the delay elements 204_1, 204_2, . . . 204_6 may be spaced substantially equally apart. Two delay elements 204_6 and 204_1 of the delay elements 204_1, 204_2, . . . 204_6 may be spaced differently than the plurality of delay elements that are spaced substantially equally apart. A second time delay path 206 may be coupled to the first time delay path 202 between the two delay elements 204_6 and 204_1 that are spaced differently.

In one implementation, the delay elements 204_1, 204_2, . . . 204_6 are coupled in series and form a ring of delay elements of the first time delay path 202. Each of the delay elements 204_1, 204_2, . . . 204_6 may have an input and an output, and an output of a delay element 204_$i$ may be coupled to an input of a subsequent delay element 204_$i+1$ excluding an output of a delay element 204_6 which is coupled to an input of a delay element 204_1 to form a feedback path and to form the ring.

A multiplexer 218 may be coupled between the output of the delay element 204_6 and the input of the delay element 204_1. At a first input, the multiplexer 218 may be coupled to an input terminal 208 to receive a timing event. At a second input, the multiplexer 218 may be coupled to the output of the delay element 204_6 to form the ring. The multiplexer 218 may selectively provide the timing event received at the input terminal 208 or the output of the delay element 204_6 to the input of the delay element 204_1. By way of the multiplexer 218, either a previously received timing event may be looped repeatedly in the first time delay path 202 or a newly received timing event may be injected into the first time delay path 202.

Additionally or alternatively, a buffer 220 may be coupled between the output of the delay element 204_6 and the input of the delay element 204_1. The buffer 220 may decouple the output of the delay element 204_6 from the feedback path and it may amplify the output of the delay element 204_6. In one implementation, for symmetry reasons, a dummy buffer (not shown) may be coupled to the output of each of the delay elements 204_1, 204_2, . . . 204_5.

A timing event may propagate through the first time delay path 202 and may be delayed between an output of a delay element and an input of a subsequent delay element. A delay T1 of the timing event between any two adjacent delay elements 204_1, 204_2, . . . 204_6 of the first time delay path 202 may be substantially the same. The timing event may be delayed between an output of the delay element 204_6 and an input of the delay element 204_1 by a delay T2 that is different from the delay T1.

A connection between any two adjacent, equally spaced, delay elements of the first time delay path 202 may be substantially the same, and the delay T1 of a timing event produced by the connection between the equally spaced delay elements may be substantially the same. The delay T1 produced by the connection may be determined by a driver strength of a delay element, a connection line between the delay element and a subsequent delay element and an input load of the subsequent delay element. Any two adjacent, equally spaced, delay elements may be directly coupled to each other, and there may not be any intermediate elements. A length of a connection line between the two delay elements 204_6 and 204_1 that are spaced differently may be longer than a length of the connection line between the equally spaced delay elements. The delay elements 204_1, 204_2, . . . 204_6 of the first time delay path 202 may be arranged in a line and the connection line between the two delay elements 204_6 and 204_1 may be bent to form a feedback path from the output of the last delay element 204_6 of the line to the input of the first delay element 204_1 of the line. An intermediate element, e.g. the multiplexer 218 or the buffer 220, may be placed between the delay element 204_6 and the delay element 204_1. Therefore, the delay T2 of a timing event produced by the connection and/or the intermediate element between the delay element 204_6 and the delay element 204_1 may be bigger than the delay T1.

The second time delay path 206 may be coupled to the output of the delay element 204_6. The second time delay path 206 may include a plurality of delay elements 212_1, 212_2, 212_3 and 212_4 that may be implemented as buffer elements and that may be spaced substantially equally apart. A delay T1 of a timing event between any two of the delay elements 212_1, 212_2, 212_3 and 212_4 of the second time delay path 206 may be substantially the same as the delay T1 of the timing between the delay elements 204_1, 204_2, ... 204_6 of the first time delay path 202 that are substantially equally spaced apart. The plurality of delay elements 212_1, 212_2, 212_3 and 212_4 of the second time delay path 206 may be coupled in series to the delay elements 204_1, 204_2, ... 204_6 of the first time delay path 202. The plurality of delay elements 212_1, 212_2, 212_3 and 212_4 of the second time delay path 206 and the delay elements 204_1, 204_2, ... 204_6 of the first time delay path 202 may be arranged in a line to form a chain of substantially equally spaced delay elements. In one implementation, for symmetry reasons, a dummy buffer (not shown) may be coupled to the output of each of the delay elements 212_1, 212_2, 212_3 and 212_4.

As illustrated and described in connection with FIG. 1, the delay D produced by delay elements that are spaced substantially equally apart may be different. However, the sum of the delay D and a delay T1 produced by the connection between two of the equally spaced delay elements may be substantially the same. The delay of a timing event between an input of a delay element and an input of a subsequent delay element may be substantially the same.

The delay elements 204_1, 204_2, ... 204_6 of the first time delay path 202 that are arranged in a ring configuration may form a first propagation path 214 for a timing event received at the input terminal 208. The delay elements 212_1, 212_2, 212_3 and 212_4 of the second time delay path 206 and the delay elements 204_1, 204_2, ... 204_6 of the first time delay path 202 that are arranged in a line may together form a second propagation path 216 for the timing event received at the input terminal 208. The timing event may propagate partly in parallel through the first propagation path 214 and through the second propagation path 216.

The first time delay path 202 may be used to measure a propagation time of the timing event received at the input terminal 208. As the delay elements 204_1, 204_2, ... 204_6 of the first time delay path 202 are arranged in a ring configuration, the timing event may loop in the first time delay path 202 repeatedly. Therefore, the device 200 may measure a larger propagation time than the device 100 of FIG. 1.

An accuracy of a measurement of the propagation time in the first time delay path 202 may be deteriorated by a discontinuity caused by an irregular spacing of the delay element 204_6 and the delay element 204_1. The connection between the delay element 204_6 and the delay element 204_1, the multiplexer 218 and the buffer 220 may form an irregular section of the first time delay path 202. The second time delay path 206 may be used to correct an inaccuracy caused by the irregular spacing of the delay elements 204_6 and 204_1 of the first time delay path 202. The timing event may propagate through the delay elements 204_1, 204_2, ... 204_6 of the first time delay path 202. Starting from node 210, the timing event may propagate partly in parallel through the delay elements 212_1, 212_2, 212_3 and 212_4 of the second time delay path 206 and through the irregular section of the first time delay path 202. As the plurality of delay elements 204_1, 204_2, ... 204_6 of the first time delay path 202 and the delay elements 212_1, 212_2, 212_3 and 212_4 of the second time delay path 206 together form a line of equally spaced delay elements, the second time delay path 206 may be used to correct the inaccuracy caused by the discontinuity in the first time delay path 202.

Figure 3:
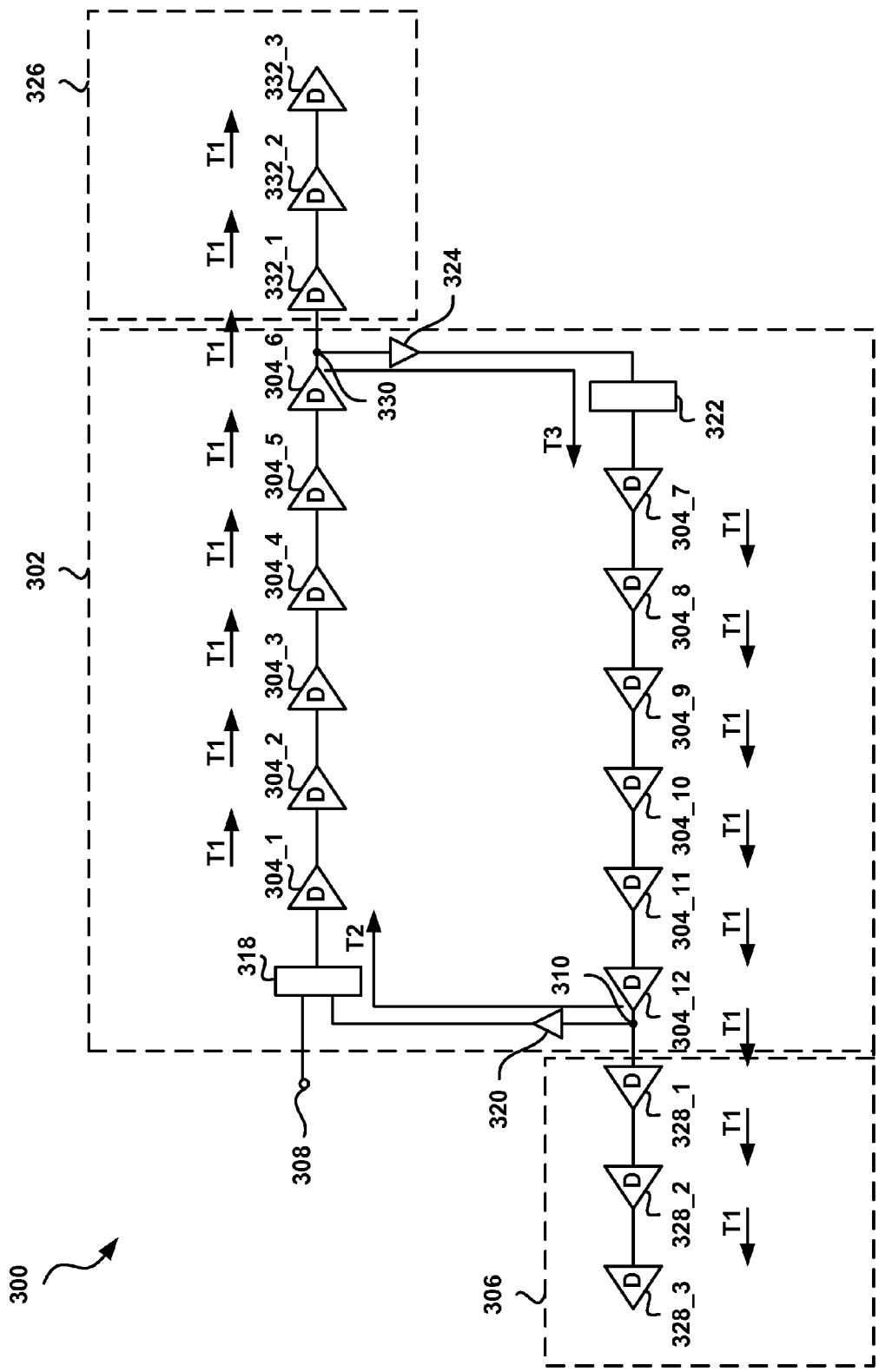
FIG. 3 shows an exemplary device with a first irregular section and with a second irregular section.

FIG. 3 shows an exemplary device 300 with a first time delay path 302. The first time delay path 302 may include delay elements 304_1, 304_2, ... 304_12 that may be implemented as buffer elements. The delay elements 304_1, 304_2, ... 304_12 may be coupled serially in a ring configuration. An output of a delay element 304_$i$ may be coupled to an input of a delay element 304_$i$+1 and an output of the delay element 304_12 may be coupled to an input of the delay element 304_1 to form the ring. A plurality of the delay elements 304_1, 304_2, ... 304_12 may be substantially equally spaced apart, and a timing event may be delayed between any two substantially equally spaced delay elements by a same delay T1.

A regular structure of equally spaced delay elements of the first time delay path 302 may be interrupted at least twice. A first irregular section may be formed between the delay element 304_12 and the delay element 304_1. A timing event may be delayed between the output of delay element 304_12 and the input of delay element 304_1 by a delay T2 that is different from the delay T1. A second irregular section may be formed between the delay element 304_6 and the delay element 304_7. The timing event may be delayed between an output of the delay element 304_6 and an input of the delay element 304_7 by a delay T3 that is different from the delay T1 and that may be also different from the delay T2.

At least pulse generators 318 and 322 may be embedded in the first time delay path 302. Each of the pulse generators 318 and 322 may receive the timing event and may provide a pulse signal responsive to the timing event. The first irregular section may include the pulse generator 318 and a buffer 320 that may be coupled between the output of the delay element 304_12 and the input of the delay element 304_1. The pulse generator 318 may provide a pulse signal with a predetermined pulse width to the input of the delay element 304_1. At a first input, the pulse generator 318 may be coupled to an input terminal 308, and the pulse generator 318 may create a pulse signal with a predetermined pulse width responsive to a timing event received at the input terminal 308. At a second input, the pulse generator 318 may be coupled to the output of the delay element 304_12 via the buffer 320. The pulse generator 318 may create a pulse signal with a predetermined pulse width responsive to a timing event received from the output of the delay element 304_12. The timing event received from the output of the delay element 304_12 may be a pulse signal that has propagated through the delay elements 304_1, 304_2, ... 304_12 of the first time delay path 302. Due to parasitic effects, the pulse width of the pulse signal may have changed during propagation. The pulse generator 318 may be used to provide a fresh pulse signal with a predetermined pulse width responsive to the pulse signal received from the delay element 304_12. Therefore, the pulse generator 318 may counteract pulse shrinking and pulse growing of a pulse signal that may manifest in the first time delay path 302.

The second irregular section may include the pulse generator 322 and a buffer 324 that may be coupled between the output of the delay element 304_6 and the input of the delay element 304_7. An input of the pulse generator 322 may be coupled to the output of the delay element 304_6 via the buffer 324. The timing event received from the output of the delay element 304_6 may be a pulse signal that has propagated through a plurality of the delay elements 304_1, 304_2, . . . 304_12 of the first time delay path 302. Due to parasitic effects, the pulse width of the pulse signal may have changed during propagation. Similar to the pulse generator 318, the pulse generator 322 may be used to provide a fresh pulse signal with a predetermined pulse width responsive to a pulse signal received from the delay element 304_6.

The first time delay path 302 may be used to measure a propagation time of the timing event received at the input terminal 308. The pulse generator 318 may generate a pulse signal responsive to the timing event, and the pulse signal may loop in the first time delay path 302 repeatedly.

An accuracy of a measurement of the propagation time may be deteriorated by an irregular spacing of the delay elements 304_6 and 304_7 and by an irregular spacing of the delay elements 304_12 and 304_1. A second time delay path 306 and a third time delay path 326 may be used to correct an inaccuracy caused by the irregular spacings. The second time delay path 306 may be coupled to a node 310 of the first time delay path between the two delay elements 304_12 and 304_1. The second time delay path 306 may include a plurality of delay elements 328_1, 328_2 and 328_3. The third time delay path 326 may be coupled to a node 330 of the first time delay path 302, between the two delay elements 304_6 and 304_7. The third time delay path 326 may include a plurality of delay elements 332_1, 332_2 and 332_3.

As illustrated and described in connection with FIG. 3, the second time delay path 306 may be used to correct an inaccuracy caused by the irregular spacing of the delay elements 304_12 and 304_1. The third time delay path 326 may be used to correct an inaccuracy caused by the irregular spacing of the delay elements 304_6 and 304_7. Compared to the implementation as illustrated and described in connection with FIG. 2, the delay T2 of FIG. 3 may be shorter than the delay T2 of FIG. 2 and also the delay T3 of FIG. 3 may be shorter than the delay T2 of FIG. 2.

Figure 4:
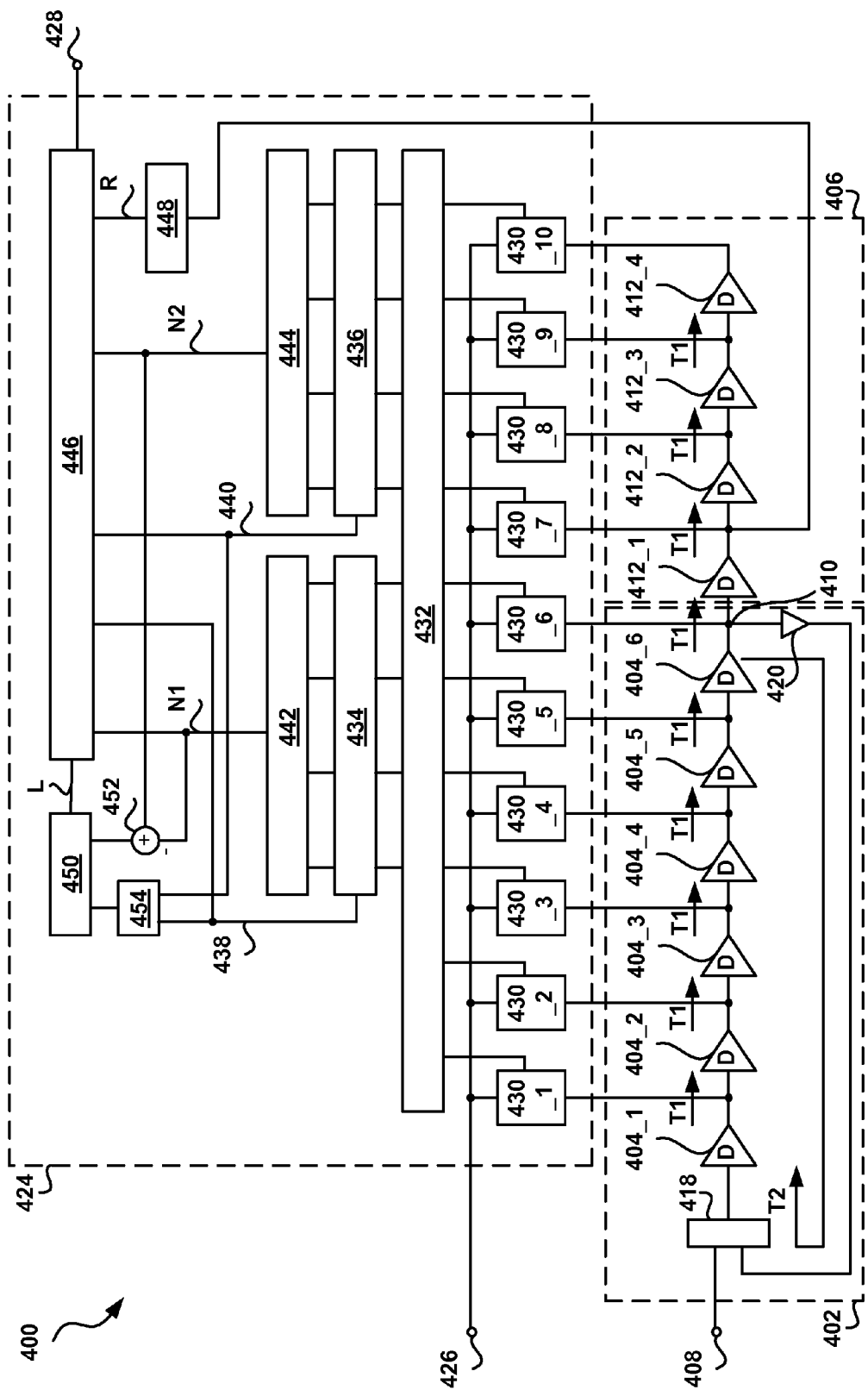
FIG. 4 shows an exemplary time-to-digital converter.

FIG. 4 shows an exemplary time-to-digital converter (TDC) 400. The TDC 400 may receive a timing event at an input terminal 408 and may include a first time delay path 402 and a second time delay path 406. The first time delay path 402 may include delay elements 404_1, 404_2, . . . 404_6 and a plurality of the delay elements 404_1, 404_2, . . . 404_6 may be spaced substantially equally apart. Two delay elements 404_6 and 404_1 may be spaced differently than the plurality of delay elements that are spaced substantially equally apart. The second time delay path 406 may be coupled to the first time delay path 402. In one implementation, as is similarly illustrated and described in connection with FIGS. 1-3, the second time delay path 406 may be coupled to a node 410 of the first time delay path 402 between the two delay elements 404_6 and 404_1 that are spaced differently. In one implementation, the second time delay path 406 may be coupled to the first time delay path 402 between any of the plurality of delay elements that are substantially equally spaced apart. The second time delay path 406 may be coupled to the first time delay path 402 in the vicinity of the two delay elements 404_6 and 404_1 that are spaced differently, e.g., it may be coupled to the first time delay path 402 between the delay element 404_5 and the delay element 404_6.

The delay elements 404_1, 404_2, . . . 404_6 of the first time delay path 402 may be coupled in a ring configuration. A pulse generator 418 may be embedded in the first time delay path 402 and may inject the timing event received at the input terminal 408 into the first time delay path 402. Additionally or alternatively, the pulse generator 418 may refresh a previously injected timing event propagating within the first time delay path 402 and may loop the previously injected timing event repeatedly in the first time delay path 402. The pulse generator 418 and a buffer 420 may be coupled between an output of a delay element 404_6 and an input of a delay element 404_1.

The second time delay path 406 may include delay elements 412_1, 412_2, 412_3 and 412_4 that may be coupled in series. An input of the delay element 412_1 of the second time delay path 406 may be coupled to the node 410 of the first time delay path 402 between the two delay elements 404_6 and 404_1 that are spaced differently. The delay elements 412_1, 412_2, 412_3 and 412_4 of the second time delay path 406 and the delay elements 404_1, 404_2, . . . 404_6 of the first time delay path 402 may form a line of equally spaced delay elements, and the timing event may be delayed between any two adjacent delay elements by a delay T1. Between the two delay elements 404_6 and 404_1 of the first time delay path 402 that are spaced differently, the timing event may be delayed by a delay T2 that is different from the delay T1.

A control unit 424 may be coupled to the first time delay path 402 and to the second time delay path 406. The control unit 424 may measure a time interval and may provide a digital output at an output terminal 428 in accordance with a propagation time of the timing event through the first time delay path 402. The control unit 424 may correct an error induced by the two delay elements 404_6 and 404_1 of the first time delay path 402 that are spaced differently.

The control unit 424 may include a plurality of sampling elements 430_1, 430_2, . . . 430_10. Each of the sampling elements 430_1, 430_2, . . . 430_10 may be assigned to one of the delay elements 404_1, 404_2, . . . 404_6, 412_1, 412_2, 412_3 and 412_4 of the first time delay path 402 and of the second time delay path 406. The sampling elements 430_1, 430_2, . . . 430_10 may be coupled to an associated one of the delay elements 404_1, 404_2, . . . 404_6, 412_1, 412_2, 412_3 and 412_4. An input of each of the sampling elements 430_1, 430_2, . . . 430_10 may be supplied by an output of an associated one of the delay elements 404_1, 404_2, . . . 404_6, 412_1, 412_2, 412_3 and 412_4. For example, an input of sampling element 430_1 may be supplied by an output of delay element 404_1, an input of sampling element 430_2 may be supplied by an output of delay element 404_2, and so on. Each of the sampling elements 430_1, 430_2, . . . 430_10 may sample the output of the associated delay element responsive to a common reference signal that may be received at an input terminal 426. In one implementation, the sampling elements 430_1, 430_2, . . . 430_10 may be implemented as flip-flops. The reference signal may be provided to a clock-input of each of the flip-flops, and all flip-flops may be triggered by the same reference signal. The output of each of the delay elements may be provided to a data input of an associated flip-flop.

An output of each of the sampling elements 430_1, 430_2, . . . 430_10 may be supplied to an error correction unit 432. The error correction unit 432 may be included in the control unit 424 and may remove errors or "bubbles" from data received from the sampling elements 430_1, 430_2, . . . 430_10. For example, if a data "1101000000" is received from the sampling elements 430_1, 430_2, . . . 430_10, the error correction unit 432 may change a "101" bubble to "110" to produce an error corrected pattern "1110000000". A bubble, e.g. the "101" bubble, may be caused by an instability of one or several of the sampling elements 430_1, 430_2, ... 430_10 during sampling of the outputs of its associated delay elements.

The error correction unit 432 may be coupled to a first transition detector unit 434 and to a second transition detector unit 436 that may be included in the control unit 424. The first transition detector unit 434 may receive a pattern of error corrected data from the error correction unit 432 that originates from the delay elements 404_3, 404_4, 404_5, 404_6 of the first time delay path 402. The first transition detector unit 434 may identify a '1'-to-'0' transition or a '0'-to-'1' transition in the pattern received from the error correction unit 432. It may activate a first transition signal 438, e.g. drive the first transition signal 438 to a logic '1' value, when a transition has been identified. The second transition detector unit 436 may receive a pattern of error corrected data from the error correction unit 432 that originates from the delay elements 412_1, 412_2, 412_3 and 412_4 of the second time delay path 406. The second transition detector unit 436 may activate a second transition signal 440, e.g. drive the second transition signal 440 to a logic '1' value, when a transition in the pattern has been identified.

As shown in FIG. 4, the first transition detector unit 434 may not receive any error corrected data that originates from the delay elements 404_1 and 404_2 of the first time delay path 402. As the timing event may propagate partly in parallel through the first time delay path 402 and through the second time delay path 406, the error corrected data that originates from the delay elements 412_1, 412_2, 412_3 and 412_4 of the second time delay path 406 may provide redundant information with respect to the delay elements 404_1 and 404_2 of the first time delay path 402.

The first transition detector unit 434 may pass the data received from the error correction unit 432 to a first thermometer-to-binary decoder 442. The data received from the error correction unit 432 may be thermometer code data, and the first thermometer-to-binary decoder 442 may convert the thermometer code data into a first binary data N1. Correspondingly, the second transition detector unit 436 may pass thermometer code data received from the error correction unit 432 to a second thermometer-to-binary decoder 444, and the second thermometer-to-binary decoder 444 may convert the thermometer code data into a second binary data N2.

The control unit 424 may include an output unit 446 that may provide a binary count of the time interval being measured at the output terminal 428. The digital output may indicate the propagation time of the timing event in the first time delay path 402 and may represent an amount of time that has passed between the injection of the timing event into the first time delay path 402 and an activation of the reference signal received at the input terminal 426. The control unit 424 may provide the digital output based on states of the sampling elements 430_1, 430_2, ... 430_10. The output unit 446 may calculate the digital output based on the first binary data N1 and based on the second binary data N2. The first transition signal 438 and the second transition signal 440 may be coupled to the output unit 446 to indicate a validity of the first and second binary data N1 and N2, respectively.

The output unit 446 may be coupled to a counter unit 448 and to a calibration unit 450. The counter unit 448 may count a number R of iterations for the timing event in the first time delay path 402, thus performing a coarse time measurement. For example, as shown in FIG. 4, an input of the counter unit 448 may be coupled to a connection line between the delay element 412_1 and the delay element 412_2 of the second time delay path 406 to count the number R of iterations for the timing event in the first time delay path 402.

The calibration unit 450 may be coupled to a summing unit 452 that may subtract the first binary data N1 from the second binary data N2, and that may provide a result of the subtraction to the calibration unit 450. Furthermore, the calibration unit 450 may receive a signal from an AND-gate 454 that may receive the first transition signal 438 and the second transition signal 440. The signal provided by the AND-gate 454 may indicate to the calibration unit 450 a validity of the result provided by the summing unit 452. The calibration unit 450 may supply a control word L to the output unit 446.

In accordance with the TDC 400 shown in FIG. 4, depending on an extend of a propagation of a timing event, one of the following three situations may occur when the reference signal received at the input terminal 426 becomes active. First, the first transition detector unit 434 may detect a transition and may activate the first transition signal 438, and the second transition detector unit 436 may not detect any transition. Second, the second transition detector unit 436 may detect a transition and may activate the second transition signal 440, and the first transition detector unit 434 may not detect any transition. Third, the first transition detector unit 434 may detect a transition and may activate the first transition signal 438, and the second transition detector unit 436 may detect a transition and may activate the second transition signal 440.

In the third situation, a calibration of the TDC 400 may be performed, and the calibration unit 450 may calculate the control word L. The control word L may represent a propagation time of the timing event through one loop of the first time delay path 402, i.e. the time that it takes for the timing event to pass one iteration in the first time delay path 402. The control word L may be a binary data that may be calculated by the calibration unit 450 according to $L=N+N2-N1$. The value N may be a binary data that may represent a propagation time of the timing event through delay elements of the first time delay path 402 that are substantially equally spaced. For example, the value N may correspond to a propagation time of the timing event from an input of a delay element 404_4 to the node 410. The value of N2−N1 may represent a propagation time for the timing event through a section of the first time delay path 402 that includes two delay elements that are spaced differently than the delay elements that are substantially equally spaced apart. For example, the value of N2−N1 may represent a propagation time of the timing event from the node 410 to the input of the delay element 404_4.

The calibration unit 450 may operate in the background by updating the control word L during operation of the TDC 400. Thus, the control word L may be continuously adapted to current voltage and temperature conditions. The calibration unit 450 may update the control word L whenever the third situation occurs during operation. Additionally or alternatively, the calibration unit 450 may perform an initial calibration at a start-up of the TDC 400 by providing a valid control word L after a reset of the TDC 400. Thus, the control word L may be adapted to process, voltage and temperature conditions that were present at the start-up of the TDC 400.

Each of the delay elements 404_1, 404_2, ... 404_6, 412_1, 412_2, 412_3 and 412_4 of the first time delay path 402 and of the second time delay path 406 may produce substantially the same delay D. Alternatively, the first time delay path 402 may include a digitally adjustable delay element to increase a linearity of the TDC 400. For example, a delay length Da of a delay element 404_1 of the first time delay path 402 may be adjusted during a calibration phase of the TDC 400. The adjustable delay element 404_1 may be tuned to the delay length Da where (T2+Da) may be a multiple of (T1+D).

The digital output provided by the control unit 424 at the output terminal 428 may represent the amount of time that has passed between an injection of a timing event into the first time delay path 402 and an activation of a reference signal. The reference signal may operate as a stop signal, and the control unit 424 may provide the digital output with respect to the stop signal. In the first situation and in the third situation, the output unit 446 may calculate the digital output according to R*L+N1. In the second situation, the output unit 446 may calculate the digital output according to R*L+N+N2.

The digital output provided at the output terminal 428 may represent an accurate value of the propagation time of the timing event in the first time delay path 402, and the TDC 400 may have a high linearity. The TDC 400 may account for irregularities in the structure of the first time delay path 402 and may compensate for any inaccuracies of the measurement of the propagation time that may be caused by those irregularities. As it is possible to compensate for any irregularities in the structure, the effort to implement the TDC 400, e.g. to provide a physical layout of the TDC 400, may be low. Further, the design of the TDC 400 may be adapted easily to different architectures and to different technologies, i.e., the TDC 400 may have a good reusability.

One or several timing events may propagate through the time delay paths as illustrated and described in connection with FIGS. 1-4, and time intervals may be measured simultaneously. Additionally or alternatively, consecutive time intervals may be measured continuously, with little or no "dead time" between measurements.

Various types of TDCs may be used in the implementations as illustrated and described in connection with FIGS. 1-4. These implementations may require minor modifications to accommodate different TDC types. As illustrated and described in connection with FIGS. 1-4, the present technique may be implemented using a tapped line of delay elements. Examples of other types of TDC principles that may be used in different implementations include Vernier delay line based TDCs, pulse shrinking TDCs, TDCs employing parallel scaled delay lines, delay-locked loops or local passive time interpolation (LPI).

Figure 5:
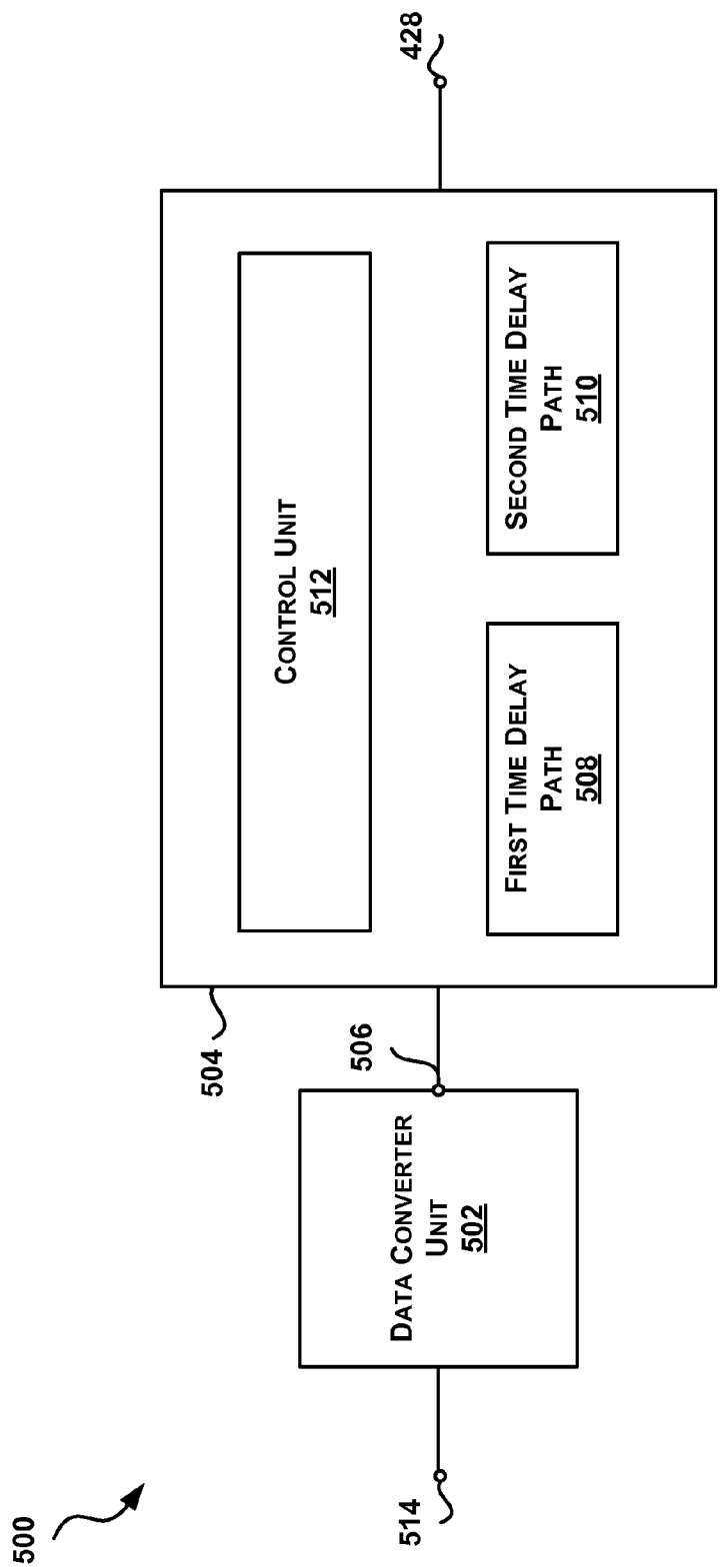
FIG. 5 shows an exemplary system that includes a data converter unit and a time-to-digital converter.

FIG. 5 shows an exemplary system 500 that includes a data converter unit 502 and a TDC 504. The data converter unit 502 may provide a timing event at an output terminal 506. The TDC 504 may be coupled to the output terminal 506 and may include a first time delay path 508, a second time delay path 510 and a control unit 512. The TDC 504 may be implemented as illustrated and described in connection with FIG. 4.

The data converter unit 502 may include an analog-to-time converter, and the analog-to-time converter may receive an analog signal at an input terminal 514. At the output terminal 506, the analog-to-time converter may provide a pulse output signal, and a length of a pulse of the pulse output signal may depend on a voltage level of the analog signal received at the input terminal 514. The system 500 may be used to perform an accurate measurement of the voltage level of the analog signal and to provide a digital output that corresponds to the voltage level.

The arrangements as illustrated and described in connection with FIGS. 1-5 may be designed and implemented in a standard digital CMOS process and may be implemented on a single semiconductor device. Alternatively, the implementation of the arrangements may be spread on several semiconductor devices.

Exemplary Method

Figure 6:
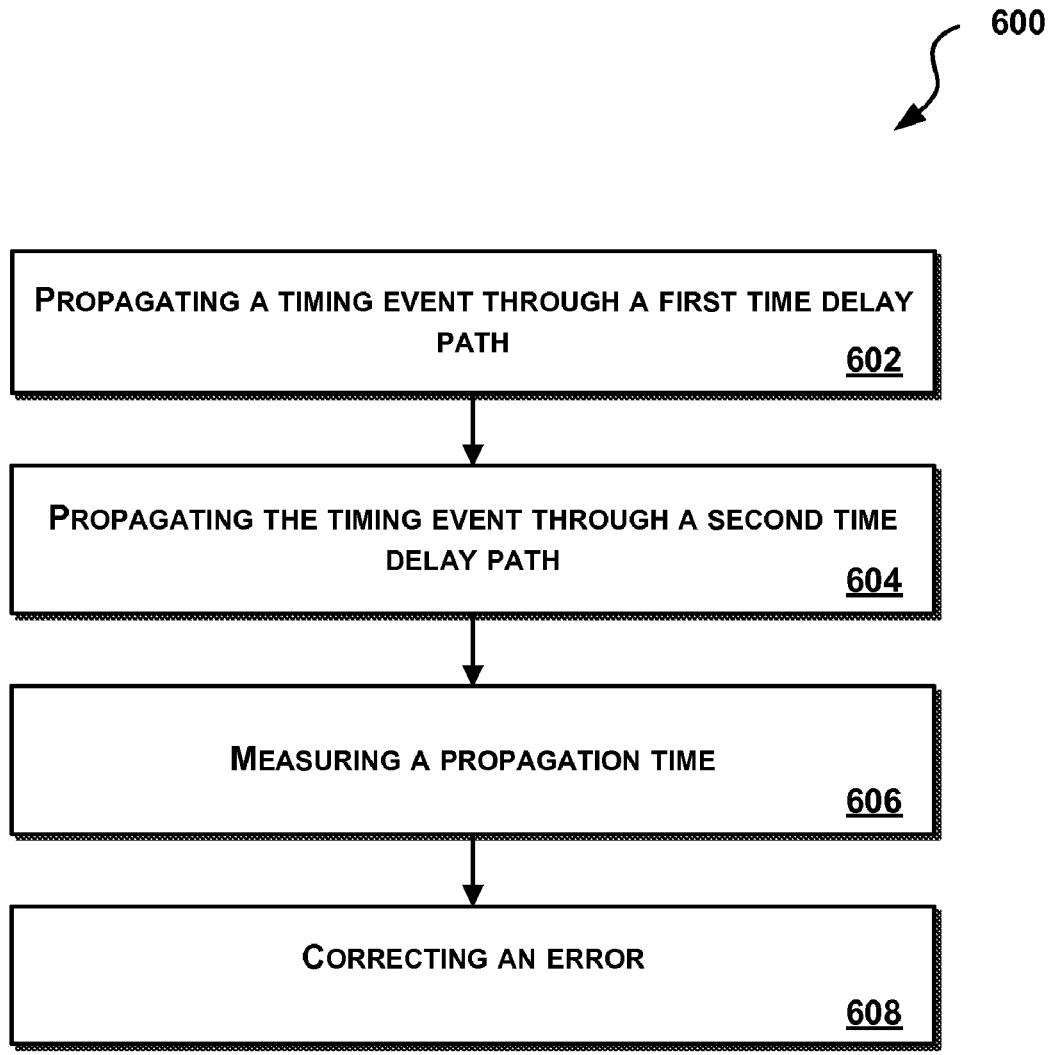
FIG. 6 shows an exemplary flow diagram that includes a number of operations for propagating a timing event.

FIG. 6 shows an exemplary flow diagram 600 that includes a number of operations for propagating a timing event. Unless stated otherwise, the order in which the operations are described is not intended to be construed as a limitation. Operations may be repetitive, may be combined in any order and/or may be in parallel to implement the process. In portions of the following discussion, reference may be made to the illustrations of FIGS. 1-5 and the subject matter thereof. The procedures described in connection with FIG. 6 may be realized utilizing the previously described implementations.

Referring to FIG. 6, at block 602, a timing event propagates through a first time delay path. The first time delay path may include a plurality of delay elements that are spaced substantially equally apart. Additionally, the first time delay path may include two delay elements that are spaced differently than the plurality of delay elements that are spaced substantially equally apart. In one implementation, the plurality of delay elements that are spaced substantially equally apart and the two delay elements that are spaced differently may be coupled in series.

At block 604, the timing event propagates through a second time delay path. At block 606, a propagation time of the timing event through the first time delay path is measured, and at block 608, an error is corrected that is induced by the two delay elements that are spaced differently. A digital output may be provided in accordance with the propagation time of the timing event through the first time delay path.

In one implementation, calibration data may be provided based on the propagation time of the timing event through the first time delay path and based on a propagation time of the timing event through the second time delay path. The calibration data may correspond to the control word L as illustrated and described in connection with FIG. 4. The calibration data may be used at block 608 to correct the error induced by the two delay elements.

CONCLUSION

For the purposes of this disclosure and the claims that follow, the term "coupled" has been used to describe how various elements interface. Such described interfacing of various elements may be either direct or indirect. Although the subject matter has been described in language specific to structural features and/or methodological acts, it is to be understood that the subject matter defined in the appended claims is not necessarily limited to the specific features or acts described. Rather, the specific features and acts are disclosed as example forms of implementing the claims. It is within the scope of this disclosure to combine various features of the different implementations and claims to produce variations thereof.

What is claimed is:

1. An apparatus, comprising:
a first time delay path having a plurality of delay elements spaced substantially equally apart and two delay elements that are spaced differently than the plurality of delay elements spaced substantially equally apart;
a second time delay path coupled to the first time delay path between the two delay elements that are spaced differently; and
a control unit coupled to the first and second time delay paths, the control unit configured to provide a digital output in accordance with a propagation time of a timing event through the first time delay path.

2. The apparatus of claim 1, wherein the plurality of delay elements spaced substantially equally apart and the two delay elements spaced differently are coupled in series.

3. The apparatus of claim 1, wherein the plurality of delay elements spaced substantially equally apart and the two delay elements spaced differently are coupled in a ring configuration.

4. The apparatus of claim 1, wherein the second time delay path comprises a plurality of delay elements.

5. The apparatus of claim 4, wherein the plurality of delay elements of the first time delay path are coupled in series and the plurality of delay elements of the second time delay path are coupled in series, wherein the plurality of delay elements of the second time delay path are spaced substantially equally apart.

6. The apparatus of claim 1, wherein the control unit comprises a plurality of sampling elements coupled to an associated one of the delay elements of the first time delay path, each of the plurality of sampling elements configured to sample, responsive to a common reference signal, an output signal of the associated delay element.

7. The apparatus of claim 6, wherein the control unit is configured to provide the digital output based on states of the sampling elements and to correct an error induced by the two delay elements that are spaced differently.

8. The apparatus of claim 1, further comprising a pulse generator embedded in the first time delay path.

9. The apparatus of claim 8, wherein the pulse generator is configured to receive a timing event and to provide a pulse signal responsive to the timing event.

10. The apparatus of claim 8, wherein the pulse generator is configured to provide a pulse signal responsive to a timing event received from an input terminal or responsive to a timing event received from a delay element.

11. The apparatus of claim 1, wherein a delay length of at least one of the delay elements is digitally adjustable.

12. A time-to-digital converter, comprising:
an input terminal configured to receive a timing event;
a first time delay path having a plurality of delay elements spaced substantially equally apart and two delay elements that are spaced differently than the plurality of delay elements spaced substantially equally apart;
a second time delay path coupled to the first time delay path; and
a control unit coupled to the first and second time delay paths, the control unit configured to provide a digital output in accordance with a propagation time of the timing event through the first time delay path and to correct an error induced by the two delay elements that are spaced differently.

13. The time-to-digital converter of claim 12, wherein the plurality of delay elements spaced substantially equally apart and the two delay elements spaced differently are coupled in a ring configuration.

14. The time-to-digital converter of claim 12, wherein the control unit is configured to receive a stop signal and to provide the digital output with respect to the stop signal.

15. A system, comprising:
a data converter unit having an output terminal and configured to provide a timing event at the output terminal; and
a time-to-digital converter coupled to the output terminal of the converter unit, the time-to-digital converter comprising:
a first time delay path having a plurality of delay elements spaced substantially equally apart and two delay elements that are spaced differently than the plurality of delay elements spaced substantially equally apart;
a second time delay path coupled to the first time delay path; and a control unit coupled to the first and second time delay paths, the control unit configured to provide a digital output in accordance with a propagation time of the timing event through the first time delay path and to correct an error induced by the two delay elements that are spaced differently.

16. The system of claim 15, wherein the data converter unit comprises an analog-to-time converter, the analog-to-time converter configured to receive an analog signal and to provide a pulse output signal, wherein a length of a pulse of the pulse output signal depends on a voltage level of the analog signal.

17. A method, comprising:
propagating a timing event through a first time delay path, the first time delay path having a plurality of delay elements spaced substantially equally apart and two delay elements that are spaced differently than the plurality of delay elements spaced substantially equally apart;
propagating the timing event through a second time delay path, the second time delay path coupled to the first time delay path;
measuring a propagation time of the timing event through the first time delay path; and
correcting an error induced by the two delay elements that are spaced differently.

18. The method of claim 17, wherein the propagating includes the timing event propagating partially in parallel through the first and second time delay paths.

19. The method of claim 17, wherein the plurality of delay elements spaced substantially equally apart and the two delay elements spaced differently are coupled in series.

20. The method of claim 17, further comprising providing a digital output in accordance with the propagation time of the timing event through the first time delay path.

21. The method of claim 17, further comprising providing calibration data based on the propagation time of the timing event through the first time delay path and based on a propagation time of the timing event through the second time delay path.

22. The method of claim 21, wherein the correcting includes using the calibration data.

* * * * *